(12) United States Patent
Slee

(10) Patent No.: US 10,122,330 B2
(45) Date of Patent: Nov. 6, 2018

(54) APPARATUS, METHOD, SYSTEM AND COMPUTER PROGRAM FOR AMPLIFYING AN AUDIO SIGNAL

(71) Applicant: Graham Slee, South Yorkshire (GB)

(72) Inventor: Graham Slee, South Yorkshire (GB)

(73) Assignee: HIFI SYSTEM COMPONENTS LIMITED, South Yorkshire (GB)

( * ) Notice: Subject to any disclaimer, the term of this patent is extended or adjusted under 35 U.S.C. 154(b) by 0 days.

(21) Appl. No.: 15/306,739

(22) PCT Filed: Mar. 23, 2015

(86) PCT No.: PCT/GB2015/050846
§ 371 (c)(1),
(2) Date: Oct. 25, 2016

(87) PCT Pub. No.: WO2015/166205
PCT Pub. Date: Nov. 5, 2015

(65) Prior Publication Data
US 2017/0126186 A1    May 4, 2017

(30) Foreign Application Priority Data
Apr. 30, 2014  (GB) .................................. 1407626.9

(51) Int. Cl.
*H03F 3/183* (2006.01)
*H03F 1/08* (2006.01)

(52) U.S. Cl.
CPC ............. *H03F 3/183* (2013.01); *H03F 1/083* (2013.01); *H03F 2200/03* (2013.01); *H03F 2200/153* (2013.01)

(58) Field of Classification Search
None
See application file for complete search history.

(56) References Cited

U.S. PATENT DOCUMENTS

| 4,117,412 A | 9/1978 | Holman, II |
| 4,312,060 A * | 1/1982 | Grodinsky ............ H03F 1/3217 330/302 |

(Continued)

OTHER PUBLICATIONS

"Low Noise, High Speed Precision Operational Amplifiers", Brochure, pp. 2-57-2-68, Linear Technology Corporation (1989).

(Continued)

*Primary Examiner* — Curtis Kuntz
*Assistant Examiner* — Qin Zhu
(74) *Attorney, Agent, or Firm* — Marshall, Gerstein & Borun LLP

(57) ABSTRACT

The present disclosure relates to an apparatus, method, system and computer program for amplifying an audio signal derived from an audio signal pickup device, the pickup device having a pickup frequency response profile. The apparatus includes:
an amplifier having a maximum open loop frequency response profile in a first frequency range including at least mid-range audible frequencies, the amplifier being configured to apply, in at least the first frequency range, a frequency response profile to the audio signal;
wherein the frequency response profile applied to the audio signal is configured such that:
it equalises the pickup frequency response profile over the first frequency range, and
a difference between a maximum amount of gain able to be applied by the amplifier and an amount of gain applied to the audio signal by the amplifier is substantially constant throughout the first frequency range.

14 Claims, 7 Drawing Sheets

(56) References Cited

U.S. PATENT DOCUMENTS

| | | | |
|---|---|---|---|
| 4,459,554 A | 7/1984 | Mattisson | |
| 4,470,020 A | 9/1984 | Mohr | |
| 4,547,819 A | 10/1985 | Meitner et al. | |
| 2011/0055877 A1* | 3/2011 | Lesso | H03F 1/304 725/75 |
| 2012/0039485 A1* | 2/2012 | Robinson | H03G 5/005 381/103 |
| 2014/0132341 A1* | 5/2014 | Wang | H03F 1/14 330/69 |

OTHER PUBLICATIONS

"Three High Accuracy RIAA/IEC MC and MM Phono Preamplifiers", Application Note, Analog Devices, 5 pages (admitted prior art).

Hood, Audio Preamplifier Design, Electronics World, 96(1652):505-10 (1990).

International Search Report and Written Opinion, International Application No. PCT/GB2015/050846, dated Jul. 23, 2015.

Jung, Op-Amp Audio, Electronic Design, pp. 132-134 (Dec. 1, 1998).

Jung, The Integrator and the Differentiator, pp. 344-345, In: IC Op-amp Cookbook, 2nd ed., Indianapolis, IN: Sams Publishing (1980).

Macaulay, Low-Distortion Phono Amplifer, Electronics World, 105(1753):62 (1999).

McKnight, The Frequency Response of Magnetic Recorders for Audio, Journal of the Audio Engineering Society, 8(3):146-53 (1960).

Riegstra, RIAA Phone Preamplifier, Elektor Electronics, 29(323):26-27 (2003).

Search Report, Great Britain Patent Application No. GB1407626.9, dated Oct. 21, 2014.

\* cited by examiner

APPARATUS, METHOD, SYSTEM AND COMPUTER PROGRAM FOR AMPLIFYING AN AUDIO SIGNAL

TECHNOLOGICAL FIELD

Examples of the present disclosure relate to an apparatus, method, system and computer program for amplifying an audio signal. In particular, though without prejudice to the foregoing, certain examples relate to an apparatus, method, system and computer program for providing pre-amplification for a phonographic audio signal.

BACKGROUND

Phono preamplifiers (sometimes called phono stages; phono equalisers; RIAA (Recording Industries Association of America) preamps; or RIAA equalisers) may be used in professional or domestic high fidelity systems as part of an amplifier, a general preamplifier, or as a stand-alone unit, e.g. where a turntable used for playing records has no amplifier of its own.

Phonographic audio signals, e.g. electrical signals generated by a pickup device (such as a magnetic phono cartridge) from an analogue sound storage medium (such as a record/vinyl), may undergo a pre-amplification stage in a phono preamplifier prior to a main amplification stage (following which the further amplified audio signal may be outputted, e.g. via one or more speakers). Such phonographic audio signals represent audio/sound/music recorded on the record picked up via the pickup device. A record is typically mastered to a particular record frequency response profile, i.e. a standard's frequency response reproduction curve such as the RIAA record response or the "The New Orthophonic Standard".

The frequency response profile of FIG. 3C is typically considered as being the RIAA record output response to be equalised. Conventional phono preamplifiers seek to provide both an equalisation function as well as a (pre)amplification function of an input phono signal. The equalisation function seeks to modify the frequency spectrum of the input phono audio signal so as to equalise/compensate for the frequency response profile, i.e. 'flattening out' the response curve of FIG. 3C.

Conventional pre-amplification systems are not always optimal and can suffer from various issues including one or more of:

audible effects in the resultant audio output;

a complex arrangement of circuitry/components, e.g. a series or cascade of one or more active/amplification stages (to 'fold up') and/or one or more passive/filter stages (to 'fold down') regions of the record response curve at its various inflection points to flatten out/equalise the curve. Such complex arrangements of electrical components can present difficulties in determining appropriate values of the electrical components to use since the various components in the complex arrangement can interact and affect each other;

instability;

clipping and/or a low signal to noise ratio in the resultant audio output (too little gain results in a low signal to noise ratio, and too much gain results in the early onset of clipping.

The listing or discussion of any prior-published document or any background in this specification should not necessarily be taken as an acknowledgment that the document or background is part of the state of the art or is common general knowledge. One or more aspects/examples of the present disclosure may or may not address one or more of the background issues.

BRIEF SUMMARY

According to at least some but not necessarily all examples of the disclosure there is provided an apparatus for amplifying an audio signal derived from an audio signal pickup device, the pickup device having a pickup frequency response profile, the apparatus comprising:

an amplifier having a maximum open loop frequency response profile in a first frequency range comprising at least mid-range audible frequencies, the amplifier being configured to apply, in at least the first frequency range, a frequency response profile to the audio signal;

wherein the frequency response profile applied to the audio signal is configured such that:

it equalises the pickup frequency response profile over the first frequency range, and a difference between a maximum amount of gain able to be applied by the amplifier and an amount of gain applied to the audio signal by the amplifier is substantially constant throughout the first frequency range.

According to at least some but not necessarily all examples of the disclosure there is provided a method for amplifying an audio signal derived from an audio signal pickup device, the pickup device having a pickup frequency response profile, the method comprising causing at least in part actions that result in:

applying, in at least a first frequency range comprising at least mid-range audible frequencies, a frequency response profile to the audio signal;

wherein the frequency response profile applied to the audio signal is configured such that:

it equalises the pickup frequency response profile over the first frequency range, and a difference between a maximum amount of gain able to be applied and an amount of gain applied to the audio signal is substantially constant throughout the first frequency range.

According to at least some but not necessarily all examples of the disclosure there is provided a method for amplifying an audio signal, the method comprising causing at least in part actions that result in:

receiving an audio signal, wherein the audio signal is:

representative of an audio recording mastered at a record frequency response profile, and derived from an audio signal pickup device having a pickup frequency response profile;

applying a first frequency dependent amplitude equalisation profile to the audio signal, wherein the first frequency dependent amplitude equalisation profile is configured to equalise the effect of the pickup frequency response profile; and applying at least a second frequency dependent amplitude equalisation profile to the audio signal, wherein the at least second frequency dependent amplitude equalisation profile is configured to equalise the effect of the record frequency response profile.

According to at least some but not necessarily all examples of the disclosure there is provided a computer program that, when performed by at least one processor, causes the above mentioned methods to be performed.

According to at least some but not necessarily all examples of the disclosure there is provided an apparatus comprising means configured to cause the apparatus at least to perform the above mentioned methods.

The apparatus may take the form of circuitry, a module, a pre-amplifier or may form part of an amplification device or system.

BRIEF DESCRIPTION OF THE DRAWINGS

For a better understanding of various examples that are useful for understanding the detailed description, reference will now be made by way of example only to the accompanying drawings in which.

DETAILED DESCRIPTION

The Figures schematically illustrate an apparatus 100 for amplifying an audio signal I(f) 101 derived from an audio signal pickup device 902, the pickup device having a pickup frequency response profile P(f) 301. The apparatus comprises:

an amplifier 102 having a maximum open loop frequency response profile $G_m(f)$ 201 in a first frequency range $F_1$ comprising at least mid-range audible frequencies $F_M$, the amplifier being configured to apply a frequency response profile $G_a(f)$, in the first frequency range, to the audio signal;

wherein the frequency response profile applied to the audio signal is configured such that:

it equalises the pickup frequency response profile P(f) over the first frequency range $F_1$, and a difference between a maximum amount of gain able to be applied $G_m(f_x)$ by the amplifier and an amount of gain applied $G_a(f_x)$ to the audio signal by the amplifier is substantially constant throughout the first frequency range $F_1$.

The maximum open-loop frequency response profile $G_m(f)$ 201 relates to the maximum amount of gain able to be applied by the amplifier at various frequencies. It may correspond to an open-loop bandwidth or an open-loop (dc) gain of the amplifier. The difference between the maximum amount of gain able to be applied and an amount of gain actually applied, i.e. $G_m(f_x)-G_a(f_x)$, may correspond to a loop gain 203 applied to the audio signal by the amplifier. The loop gain is constant for all frequencies at least within the first frequency range $F_1$. The first frequency range comprises at least frequencies in the mid-range of frequencies $F_M$ of the audible frequency spectrum where the human ear is most sensitive, for example 100-5,000 Hz.

Figure 3A:
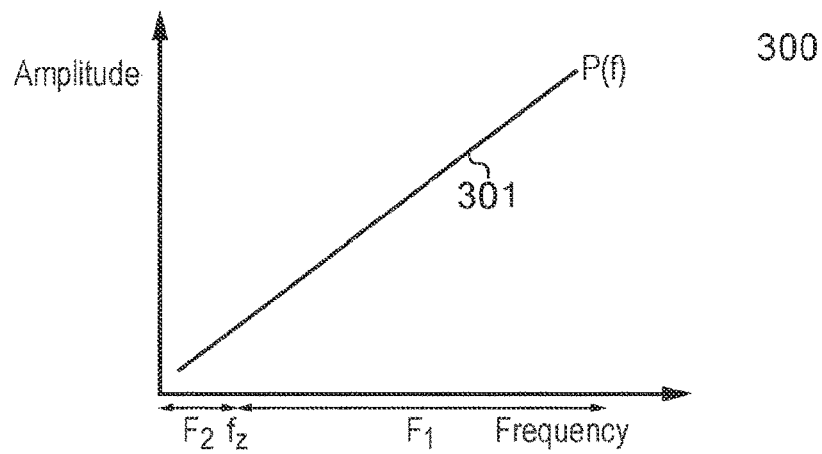
FIG. 3A schematically illustrates a pickup frequency response profile.

The apparatus is configured such that the frequency response profile $G_a(f)$ applied to the audio signal equalises the effect of the pickup frequency response profile P(f) in the audio signal over the frequency range $F_1$. For example, as shown in FIG. 3A the pickup frequency response profile could have a rising response with increasing frequency, having a rate of ascent of 20 dB/decade of frequency. In which case, the amplifier could be configured such it has a falling response with increasing frequency, e.g. a controlled open-loop roll off having a rate of descent of 20 dB/decade of frequency. Advantageously, the apparatus provides frequency-dependent gain to the audio signal to rectify the rising response of the pickup frequency response profile thereby providing equalisation with regards to the pickup frequency response profile over a first frequency range which includes at least the mid-range of audible frequencies.

The difference between the maximum amount of gain able to be applied by the amplifier and the actual amount of gain applied by the amplifier, i.e. the "loop gain", determines the input and output impedances of the amplifier. When the loop gain increases, the amplifier's input impedance increases and its output impedance decreases. When the loop gain decreases, the amplifier's input impedance decreases and the output impedance increases. It is widely held that varying the input and output impedances of the amplifier, as is done in certain conventional phono pre-amplifiers, can be a contributing factor to a degree of audible harshness that can be heard by a listener, particularly in mid-range audible frequencies, with the output from certain conventional phono pre-amplifiers.

Advantageously, in certain examples of this disclosure, the amplifier is configured such that its loop gain is constant over at least the mid-range of audible frequencies. This enables the input and output impedances of the amplifier to be constant over this range of frequencies and thus beneficially avoid/mitigate audible interference/artefacts of the pre-amplification process.

Figure 4:
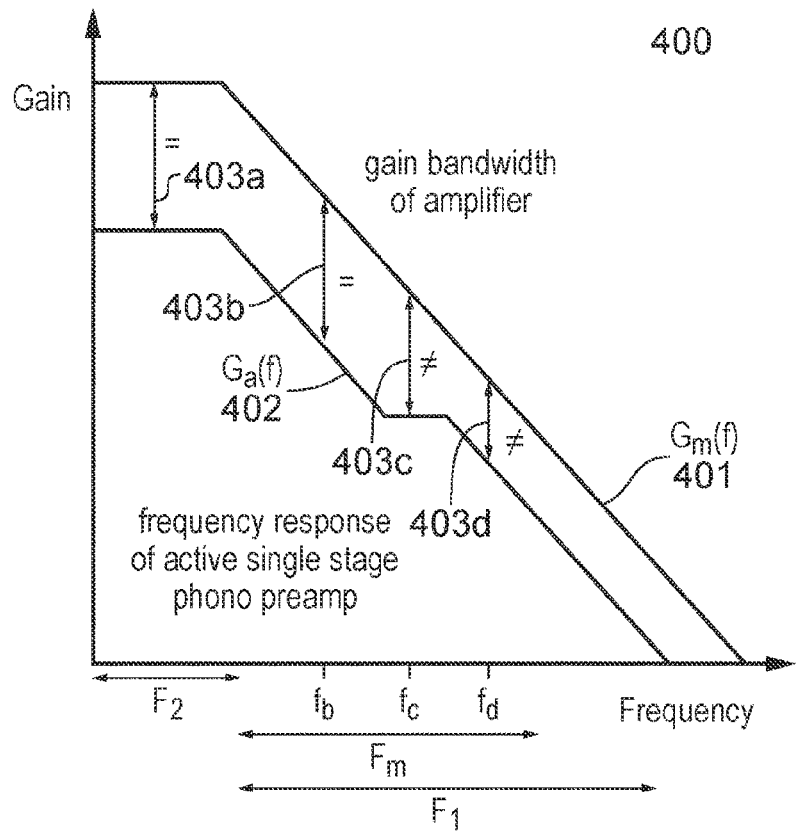
FIG. 4 schematically illustrates a frequency response product plot of a conventional pre-amplifier.

Such constant loop gain 203a-d is to be contrasted with the loop gain 403a-d provided by certain conventional preamplifiers, e.g. an active single stage phono pre-amplifier, such as shown in FIG. 4. The graph 400 of FIG. 4 shows a maximum open loop frequency response profile Gm(f) 401 and an applied frequency response profile Ga(f) 402. As will be apparent from this, the differences between the maximum gain and applied gain (loop gain) in the first frequency range is not constant, i.e. Gm(fb)−Ga(fb)≠Gm(fc)−Ga(fc)≠Gm(fd)−Ga(fd). This variation of loop gain, particularly around the mid range of audible frequencies, gives rise to varying input and output impedances to the amplifier which can cause audible harshness.

Figure 3B:
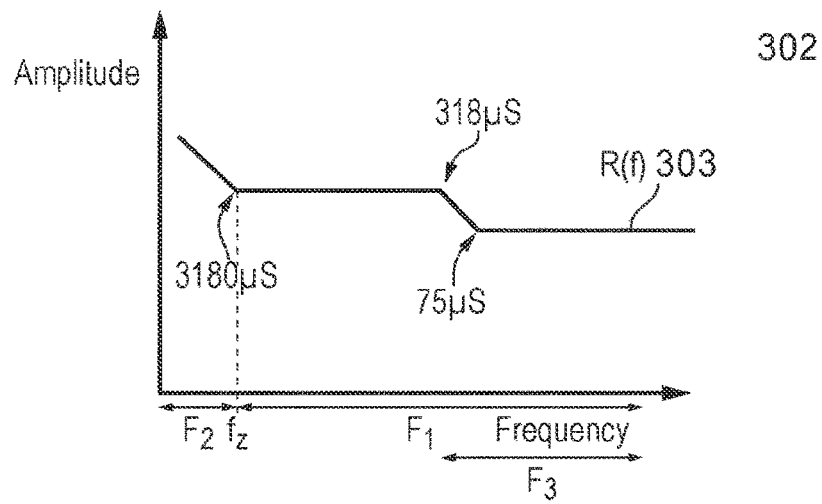
FIG. 3B schematically illustrates a record frequency response profile.
Figure 3C:
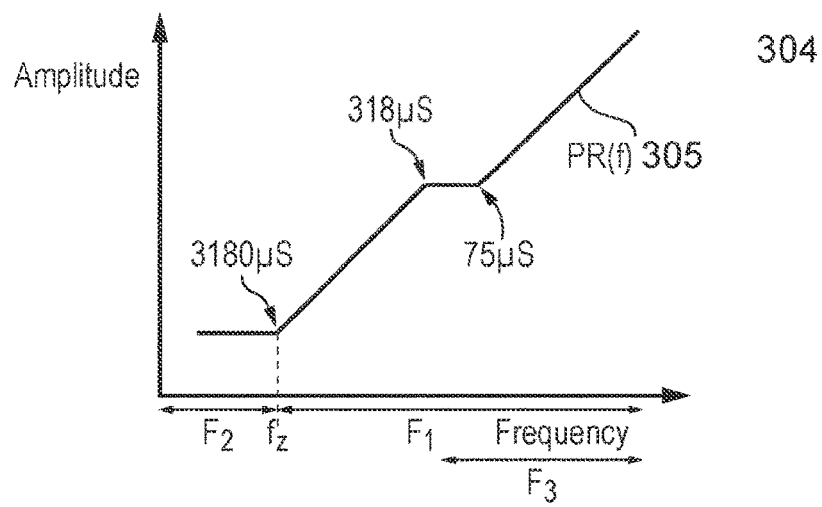
FIG. 3C schematically illustrates a resultant frequency response profile.

The audio signal may, for example, comprise a phono signal which is representative of an audio recording mastered at a particular record frequency response profile R(f), see FIG. 3B, and which is picked up from a phonographic pickup device itself having a pickup frequency response profile P(f), see FIG. 3A, such that the audio spectrum frequency of the phono signal is affected and requires equalisation/rectification/compensation to counter for the combined frequency response PR(f), i.e. to flatten out the combined frequency response PR(f) of FIG. 3C and provide an output audio signal (e.g. for further amplification, output or audio output) having a flat frequency response profile.

In certain implementation examples, the apparatus is configured such that the frequency response profile Ga(f) applied to the audio signal in a second frequency range F2, equalises the combined effect of both the pickup frequency response profile P(f) as well as the record frequency response profile R(f) in the second frequency range F2. The second frequency range F2 comprises frequencies lower than those of the first frequency range, for example less than 100 Hz or 50 Hz. In the second frequency range the pickup frequency response profile could have a rising response of 20 dB/decade of frequency. Whereas the record frequency response profile could have a falling response of 20 dB/decade of frequency in the second frequency range. Accordingly, the amplifier could be configured such that it has a flat response within the second frequency range (followed by, at a low pass corner at e.g. 50 Hz, a roll off/reducing response in the first frequency range F1 as discussed above). Advantageously, the apparatus provides frequency-dependent gain to the audio signal in the second frequency range that accommodates for both the pickup frequency response profile and the record frequency response profile and provides equalisation of the audio signal in the second frequency range.

In certain further implementation examples, the apparatus is further configured such that a frequency-dependent amplitude equalisation/compensation is applied to the audio signal to equalise/compensate for the effect of the record frequency response profile R(f) in a third frequency range F3. For example, the apparatus could comprise one or more active or passive stages, e.g. a frequency-dependent filter, to equalise/compensate/attenuate the audio signal's frequency spectrum to accommodate/flatten out the record frequency response profile.

Advantageously, the inventor of the present application has appreciated that the frequency response profile FIG. 3C which is typically considered as being the RIAA record output response actually represents a combination of the pickup device's pickup frequency response profile P(f), as shown in FIG. 3A, and the record frequency response profile R(f), as shown in FIG. 3B. With this insight, the inventor has provided an improved apparatus and method for pre-amplification which partially separates out the equalisation of the pickup response from record response by firstly equalising the audio signal to compensate for the pickup device's pickup frequency response profile P(f) and separately equalising the audio signal to compensate for remnants of the record frequency response profile R(f). In certain examples, an amplifier could be selected that has an open loop frequency response profile which matches a frequency response required to equalise/compensate for a rising amplitude of the input audio signal caused by the rising response of the pickup frequency response profile.

Certain implementation examples seek to avoid/mitigate issues of previous pre-amplification devices such as audible artifacts resulting from the pre-amplification, clipping and instabilities and provide a simplified apparatus, method and system for pre-amplification.

An example of an apparatus will now be described with reference to the Figures. Similar reference numerals are used in the Figures to designate similar features. For clarity, all reference numerals are not necessarily displayed in all figures.

Figure 1:
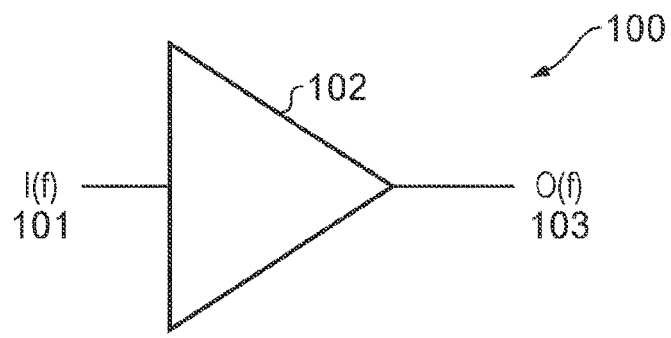
FIG. 1 schematically illustrates an example of an apparatus according to the present disclosure.

FIG. 1 schematically illustrates an apparatus 100 according to the present disclosure. The apparatus comprises an amplifier 102 configured to receive an input audio signal I(f) 101 and apply a frequency dependent gain profile Ga(f) to the input audio signal I(f) 101 to generate an amplified output signal O(f) 103. The apparatus may be for phono re-amplification. The input audio signal may be a phono signal for pre-amplification such that output signal itself may be further amplified for eventual audio output/playback.

It is to be noted that the amplifier 102 can generally be a means for amplifying a signal or an equivalent structure. The amplifier may be: an operational amplifier (such as a TL071 and similar multiples), a universal amplifier, a discrete combination of components (transistor, valve, FET etc), an op-amp FET, an emitter-degenerated BJT amplifier, or a differential input amplifier made of discrete components (such as valves (tubes), bipolar transistors, field effect transistors, or similar devices).

Figure 2:
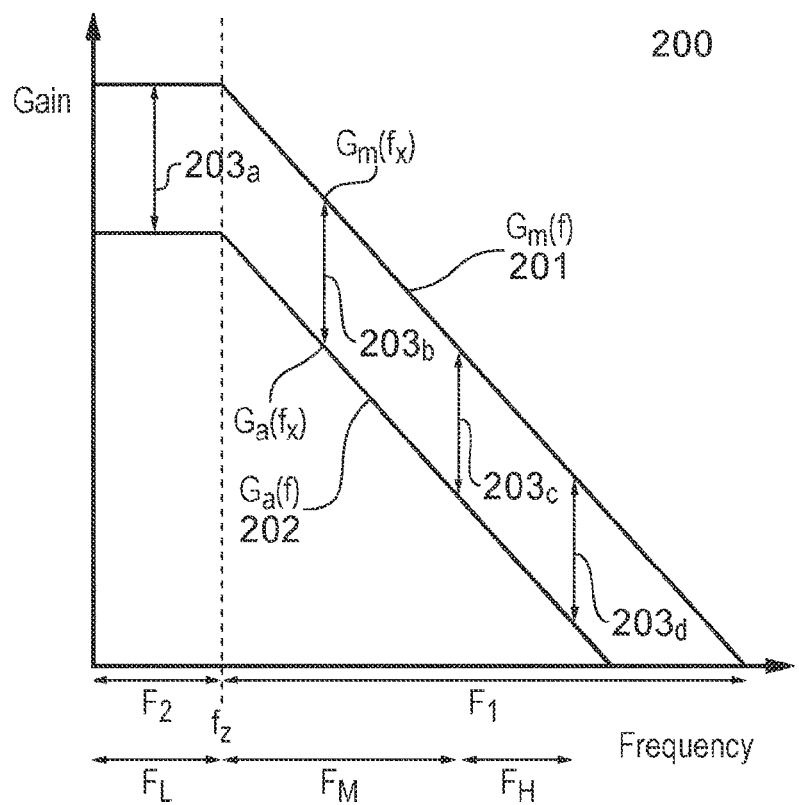
FIG. 2 schematically illustrates a frequency response plot for the apparatus of FIG. 1.

FIG. 2 shows a frequency response plot 200 for the amplifier 102. The plot shows a maximum open loop frequency response profile Gm(f) 201 of the amplifier. This outer curve 201 represents an envelope/curve of maximal (stable) gain which defines a maximum amount of gain able to be applied at each frequency. The maximum open loop frequency response profile may correspond to an open-loop (dc) gain frequency response of the amplifier.

The amplifier is configured (or selected) such that is has a particular maximum open loop frequency response profile Gm(f) 201 having the following characteristics. In a first frequency range F1, which comprises at least midrange audible frequencies FM, there is a falling response in the maximum open loop frequency response profile with increasing frequency, e.g. a controlled open-loop roll off having a particular a rate of descent, i.e. a slope of negative gradient in FIG. 2.

The mid-range of frequencies FM of the audible frequency spectrum is where the human ear is at its most sensitive. The mid-range frequencies may, for example, comprise a lower end frequency value of around: 100 Hz, 200 Hz, 300 Hz, 350 Hz and 400 Hz; and range up to a higher end frequency value of around: 1,500 Hz, 2,000 Hz, 2,500 Hz, 3,000 Hz, 4,000 Hz and 5,000 Hz.

FIG. 3A schematically illustrates a graph 300 showing a pickup frequency response profile P(f) 301 for a pickup device. The pickup device may correspond to: a transducer, pickup cartridge or magnetic phono cartridges such as: moving magnet, moving coil, moving iron, or similar types which can pick up/read an analogue audio recording stored on an analogue sound storage medium, such as a gramophone record/vinyl.

The plot shows a pickup frequency response profile P(f) 301 for a pickup device such as is customarily now used for conventional phonographs, namely magnetic phono cartridge transducers (c.f. old types such as piezo crystal or ceramic pickup devices). Magnetic phono cartridge transducers are constant velocity devices whose frequency response output rises at 20 dB per decade of frequency.

The apparatus is configured such that the frequency response profile Ga(f) applied to the audio signal is configured such that it equalises/accommodates for the pickup frequency response profile P(f) over the first frequency range, i.e. the amplifier is selected/configured such that its open-loop roll off has a rate of descent opposite to the rising response of the pickup frequency response profile.

For example, the slope of negative gradient of the maximum open loop frequency response profile Gm(f) 201 of FIG. 2 may be selected/configured so as to equalise the rising response in the pickup frequency response profile P(f) 301 of FIG. 3A. For example, the falling response of the maximum open loop frequency response profile is selected/configured to be 20 dB/decade of frequency to counter the 20 dB/decade of the rising response of a pickup frequency response profile.

In a second frequency range F2, which comprises low range audible/bass frequencies FL, there is a flat response in the maximum open loop frequency response profile with increasing frequency within the first range. The second frequency range may comprise frequencies less than at least one of: 1, 10, 20, 30, 40, 50, 60, 70, 80, 90 or 100 Hz.

After the flat response of the second frequency region, at a low pass corner/turn over point, there is the fall off in the response in the first region.

The plot 200 of FIG. 2 also shows an applied gain frequency response profile Ga(f) 202. This inner curve 202 represents an amount of gain actually applied to the audio signal at a particular frequency.

The apparatus is configured such that the frequency dependent gain profile Ga(f) 200 applied by the amplifier to the audio signal meets the following criterion:

a difference between the maximum amount of gain able to be applied Gm(fx) and an amount of gain applied (e.g. loop gain) Ga(fx) to the audio signal at each frequency within at least the first frequency range is substantially constant 203b-d. As shown in FIG. 2, the loop gain 203a is also constant in the second frequency region F2.

Thus, for all frequencies within the first frequency range $F_1$:

$$G_m(f_x) - Ga(f_x) = \text{constant value}$$

wherein the first frequency range $F_1$ comprises at least frequencies in the mid-range $F_M$ of frequencies of the audible frequency spectrum. In other examples, the frequency range may further include one or more of:
low bass frequencies, e.g. 20-80 Hz
high bass frequencies "midbass", e.g. 80-320 Hz
low treble frequencies, e.g. 1,280-5,120 Hz
high treble frequencies, e.g. 5,120-20,840 Hz
low audible frequencies $f_L$, e.g. less than 350 Hz
high audible frequencies $f_H$, e.g. greater than 1,200 Hz
the audible frequency range, e.g. 20-20,000 Hz.

In certain examples, this difference between the maximum amount of gain able to be applied Gm(f) and the actual amount of gain applied Ga(f) is known as 'loop gain'. In such examples, the loop gain is constant over at least the first frequency range.

The difference between the maximum amount of gain able to be applied by the amplifier and the actual amount of gain applied by the amplifier, i.e. the "loop gain", determines the input and output impedances of the amplifier. When the loop gain increases, the amplifier's input impedance increases and its output impedance decreases. When the loop gain decreases, the amplifier's input impedance decreases and the output impedance increases. It is widely held that varying the input and output impedances of the amplifier, as is done in certain conventional pre-amplifiers, can be a contributing factor to a degree of audible harshness in the audio output from certain conventional pre-amplifiers that can be heard by a listener, particularly in mid-range audible frequencies.

Advantageously, in certain examples, the amplifier is configured such that its loop gain is constant over at least the mid-range of audible frequencies. This enables the input and output impedances of the amplifier to be constant over this range of frequencies and thus beneficially avoid/mitigate audible interference/artefacts of the pre-amplification process.

FIG. 3B schematically illustrates a graph 302 showing a record frequency response profile R(f) 303, i.e. a standard's frequency response reproduction curve, to which an audio recording is mastered. FIG. 3B shows the RIAA (Record Industries Association of America) record response. The RIAA record response (introduced in 1953 as "The New Orthophonic Standard") describes the frequency response of the output of a record mastered to that standard's frequency response curve.

It can be seen that the record response mastering provides a bass lift below a low audio frequency followed by a flat response to a mid-frequency where it is shelved down. The corners/inflection points of the curve are specified by the following time constants: 3180 μS, 318 μS and 75 μS. These values of time constants correspond to frequencies of: 50 Hz, 500 Hz and 2122 Hz respectively [frequency=1/(2π× time constant)].

The reason for such a frequency response curve was to make records, played by the transducers (pickup devices/cartridges) of the time, sound even throughout the audible frequency range. The recording's frequency response was therefore manipulated to suit the pickup cartridges that the majority of people used at that time. Such transducers were piezo crystal or ceramic which, when loaded by the customary 1M Ohm grid resistor of a valve record player amplifier input, exhibited a rising treble response above mid frequencies due to resonance. The shelving down from 318 μS to 75 μS had the effect of making the resulting frequency response flatter to within +/−2 dB required by the RIAA standard. The bass boost below 3180 μS was to compensate for the falling output of the aforementioned transducers at low bass frequencies.

The invention of the magnetic phono cartridge transducer resulted in a more consistent pickup response, but tilted at an angle of 45 degrees: the output of a magnetic phono transducer rises in proportion with frequency. Magnetic phono cartridge transducers are constant velocity devices rather than constant amplitude and their output rises at 20 dB per decade of frequency.

FIG. 3C shows a graph 304 of a frequency response profile PR(f) 305 resultant from a conventional/typical modern day pick up device, i.e. a magnetic phono cartridge transducer, generating audio signals from a record of an audio recording mastered to the RIAA standard, i.e. the resultant response curve of FIG. 3C effectively combines the pickup response profile P(f) 301 with the record frequency response profile R(f) 303 of FIG. 3B.

Normalizing the response output of FIG. 3C with a theoretical falling response amplifier (−20 dB per decade) does not result in a flat frequency response due to the record being mastered with particular time constants. Thus, without any further normalisation/equalisation, an audio signal, when played, would not have a flat frequency response, but would have a frequency response as per FIG. 3B.

Therefore a combined equalisation is required to compensate both for the pick up's rising response as well as the original RIAA responses' time constants.

Previously, pre-amplifiers treated the input signal as being homogenous—as if the record was outputting the frequency response FIG. 3C, which is today typically thought of as being the RIAA record output response. However, this is not in fact the case. Instead, as the inventor of the present application has appreciated, it should be thought of as the record response of FIG. 3B elevated by the rising response of the magnetic phono cartridge shown in FIG. 3A.

Advantageously, the inventor of the present application has appreciated that the frequency response profile FIG. 3C which is typically considered as being the RIAA record output response actually represents a combination of the pickup device's pickup frequency response profile P(f) as shown in FIG. 3A, and the record frequency response profile R(f) as shown in FIG. 3B.

With this insight, the inventor has provided an improved apparatus and method for pre-amplification which, in certain implementation examples, partially separates out the equalisation of the pickup response from the record response by firstly equalising the audio signal to compensate for the pickup device's pickup frequency response profile P(f) over a first frequency region F1. The apparatus may be configured such that the frequency dependent gain profile Ga(f) 200 applied by the amplifier to the audio signal in a second frequency range F2 is configured to equalise/compensate for both the effect of the pickup frequency response profile and the record frequency response profile on the audio signal in the second frequency range.

Equalisation of at least a part the record frequency response profile R(f) in a third frequency region F3 takes place separately (either before the pickup response equalisation stage of afterwards). In certain examples, an amplifier could be selected that has an open loop frequency response profile which matches the frequency response required to equalise/compensate for a rising amplitude of the input audio signal caused by the rising response of the pickup frequency response profile.

In the second frequency range F2 the pickup frequency response profile P(f) could have a rising response of 20 dB/decade of frequency, as shown in FIG. 3A, whereas the record frequency response profile could have a falling response of 20 dB/decade of frequency in the second frequency range, as shown in FIG. 3B. Accordingly, the amplifier could be configured such that it has a flat response within the second frequency range up to a particular frequency fz (followed by, at a low pass corner at the particular frequency fz, a roll off/reducing response in the first range F1). The particular frequency fz may be:

dependent upon a frequency/time constant of an inflection point between two frequency regions F1 and F2 of a record frequency response profile having differing responses, dependent upon a time constant/frequency corner of a record frequency response profile (e.g. the first corner, i.e. the highest time constant/lowest frequency corner), or around 50 Hz.

Advantageously, the apparatus provides frequency dependent gain to the audio signal in the second frequency range that accommodates for both the pickup frequency response profile and the record frequency response profile and provides equalisation of the audio signal in the second frequency range.

Figure 5:
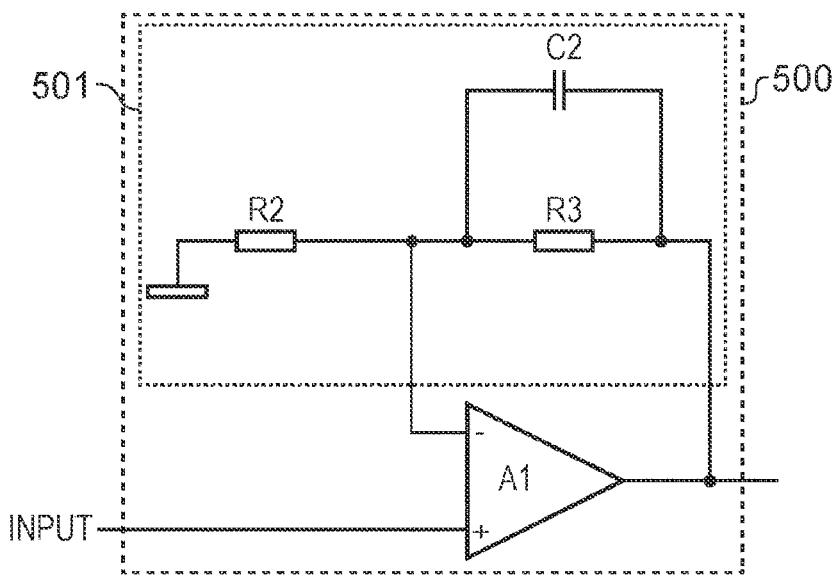
FIG. 5 schematically illustrates an example of an apparatus according to the present disclosure.

FIG. 5 schematically illustrates an example of another apparatus 500 according to the present disclosure. The apparatus comprises an amplifier A1 and which is configured to have a negative feedback loop 501 (R2, C2 and R3) comprising a low pass filter.

The open-loop gain of the amplifier A1 is chosen so as to equalise/compensate for the rising response of the pickup frequency response profile, i.e. as per FIG. 2. The amplifier can be a discrete combination of components (transistor, valve, FET etc), or can be an operational amplifier. One example of an operational amplifier fulfilling this role is the TL071 and similar multiples, which rolls off at around 50 Hz (3180 µS). The amplifier may be unity gain stable.

The feedback loop 501 may be configured to provide the constant difference between the maximum amount of gain able to be applied $G_m(f)$ and the amount of gain actually applied $G_a(f)$ to the audio signal throughout at least the first frequency range $F_1$, i.e. the feedback loop may be configured to provide a loop gain which is constant throughout at least the first frequency range $F_1$. Moreover, the low pass filter could be configured to set the frequency $f_z$ of a low pass corner, i.e. so as to correspond to frequency/time constant the record frequency response profile, 5o Hz/31280 µS.

The amplifier A1 provides a loop gain (indicated by arrows of equal magnitude as shown in FIG. 2) that is very much the same at all frequencies. Thus the input and output impedances are held constant. Therefore it is possible that the mid frequency harshness witnessed with some prior single stage active preamplifiers may not be present in implementations of the present disclosure.

Negative feedback around amplifier A1 (R3, C2 and R2) produces the necessary low pass filter response. The low pass filter has a high impedance at low frequency falling with increasing frequency because of capacitor C2 and is arranged for a 3180 µS corner fulfilling the low frequency requirement of the record frequency response profile. It also counters the rising response of the pickup device.

Advantageously, a compensation curve to compensate for the pickup response follows the open-loop gain curve of a wide number of operational amplifiers, and because the actual gain required is less than the open-loop gain, the loop gain of the cartridge response compensation amplifier, with negative feedback applied, is constant with frequency. Thereby the input and output impedances of A1, which are decided by the amount of negative feedback (loop gain), will be constant throughout the frequency spectrum and will not fluctuate due to the changing gain applied by the amplifier filter because loop gain is constant.

Advantageously, amplifier A1 is also stabilised by the low pass filter. C2 in amplifier A1's negative feedback ensures amplifier stability because the resulting bandwidth is less than the amplifier's open loop gain. Closure happens well before the amplifier's open-loop closure. As such, the possibility of radio frequency interference is vastly reduced and instability is vastly reduced/cannot occur.

As the low pass filter equalises the pickup/cartridge response, clipping and signal to noise ratio are less critical than they would be in semi-active/passive inter-stage designs. Another benefit is that the feedback capacitor C2 is operating at 50 Hz (3180 µS) which is in the ears' less sensitive area. In previous active single stage or multi-stage preamplifier designs, capacitors operating in mid frequencies must charge one direction then the other by the amplifier's output and any overshoot or lag (due to dielectric absorption) could be audible. In implementations of the present disclosure the capacitor is only in active use at low frequencies where the ear is least sensitive. Thus, advantageously, implementations do not suffer from such issues.

The active filter also has gain which is optimised so that the signal can swing between power supply rails without clipping for the maximum expected input, stated at 1 kHz for the largest output magnetic cartridge of the type it is designed for. The output being flat referenced to the cartridge output, no frequency will exceed that level.

In the example of FIG. 5, the pickup frequency response profile and the record frequency response profile in the second frequency region F2 have been dealt with in a homogenous way. However, the mid frequencies FM have been left alone so far. They are not dealt with in a homogenous way but are dealt with via separate means for effecting the equalisation of the record frequency response profile in a third frequency region F3, comprising the mid frequencies FM.

Figure 6A:
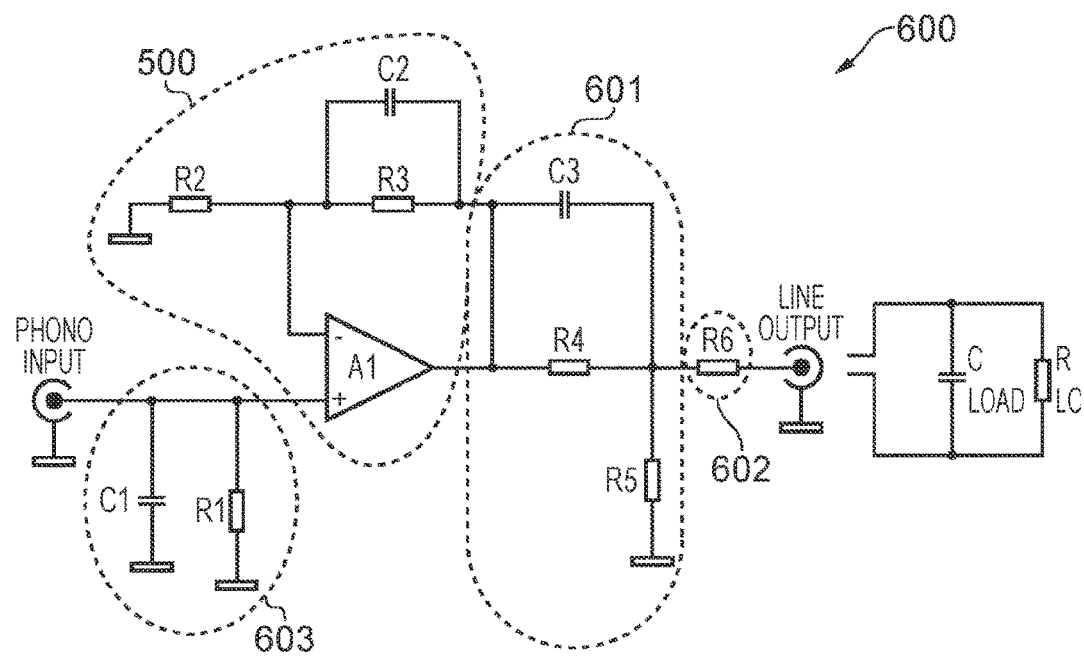
FIGS. 6A-6D schematically illustrate further examples of apparatuses according to the present disclosure.

FIG. 6A schematically illustrates a further example of an apparatus 600 according to the present disclosure. The apparatus 600 comprises the apparatus 500 of FIG. 5 and with means 601 configured to apply a frequency dependent amplitude equalisation to the audio signal in the third frequency range F3 so as to further equalise the frequency spectrum of the audio signal, e.g. with regards to the mid-frequency shelf down in the third frequency range F3 of the record frequency response profile shown in FIG. 3B.

In the example of FIG. 6, such means 601 correspond to a separate passive output filter, driven by the output of the amplifier A1 (which is essentially what the output of a 'perfect' constant amplitude phono cartridge would be, if one existed). The separate passive output filter equalises the downward 'kink' in the record's response (318 µS to 75 µS falling −12 dB in FIG. 5), by attenuating lower frequencies to a stop band dictated by the components C3, R4 and R5. This provides a boost to the signal from 318 µS to 75 µS using a simple first order resistor capacitor arrangement to equalise/compensate for the record's response, and deliver a flat overall output.

The apparatus 600 effectively separates the pickup response equalisation from the record response equalisation in the mid-range of audible frequencies, which differs from previous preamplifiers which typically seek to deal with the two responses (e.g. in a homogenous way) as if they were just one. Implementation examples of the present disclosure provide non-homogenous equalisation with its separation of the pickup response equalisation and the record response equalisation in the mid-range of audible frequencies.

In other examples, the means 601 may be active and/or may comprise one or more active or passive filter stages. The means may also be positioned before the amplification stage of the amplifier A1, rather than afterwards as shown in FIG. 6A.

The apparatus 600 also comprises means 602 configured to prevent load capacitance affecting an output of the amplified audio signal, for example output resistor R6. R6 decouples the capacitive load of the output cable from the output of A1 via C3, which prevents load capacitance, such as interconnect cable capacitance, from inserting a pole in the amplifier's response which would otherwise lead to instability. R6 can be a small value in the region of 100 Ohms, which makes very little difference to the output, but makes the amplifier stable into most expected capacitive loads. A similar resistor (not shown) could be included in the outputs of FIGS. 6C and 6D.

The apparatus 600 also comprises means 603 configured to provide peaking and damping for the pickup device/cartridge loading, for example via input resistor R1 and capacitor C1, which provide peaking and damping for highly inductive cartridges such as moving magnet types, which would otherwise suffer poor high frequency performance. Thus implementation examples retain customary input loading techniques such that they do not require the use of a specific type of, or range of specific magnetic cartridges.

The apparatus 600 may be configured for at least one of: phono pre-amplification, equalisation of a pickup frequency response profile; and equalisation of a record frequency response profile. Such an apparatus 600 provides an active-passive phono preamplifier for application with magnetic phono cartridges such as moving magnet, moving coil, moving iron, or similar types. The preamplifier comprises a forward path (an amplifier), a reverse path (voltage negative feedback) and a further forward path (a passive filter). The apparatus 600 provides a 'non-homogenous' apparatus and method of equalising pickup frequency response and a record frequency response (e.g. RIAA record response) by partially separating the pickup and record responses (i.e. providing pickup response equalisation via an active stage and record response equalisation via a separate passive stage) such that the equalisation is non-homogenous where the ear is most sensitive, that being toward the mid-range frequencies.

Figure 6B:
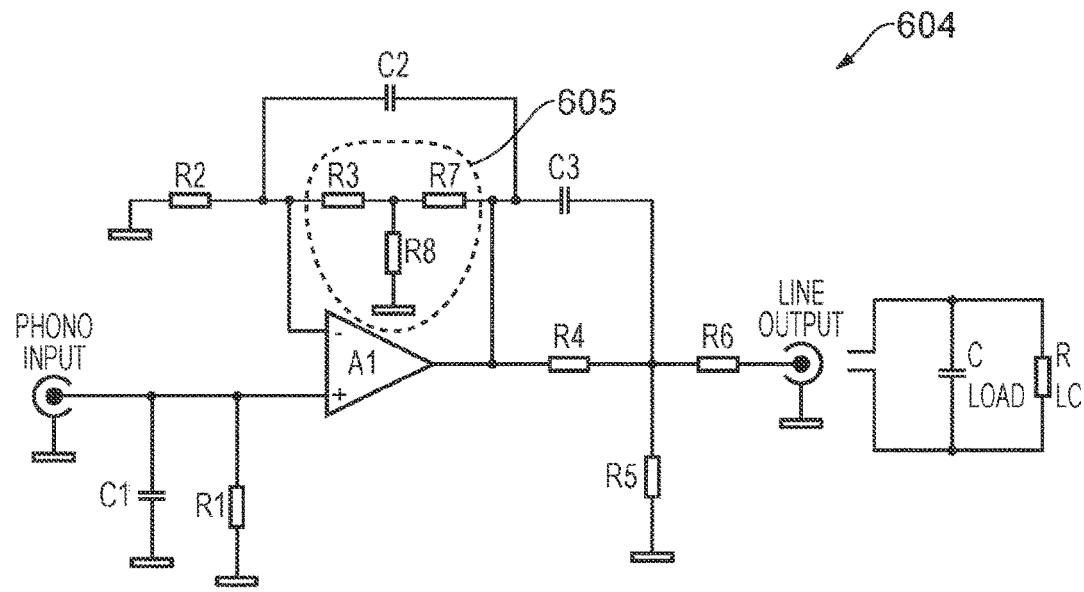

FIG. 6B schematically illustrates a further example of an apparatus 604 according to the present disclosure. The apparatus 604 is similar to the apparatus 600 of FIG. 6A, except that the resistor R3 in the feedback loop is replaced by a T network 605 of R3, R7 and R8, to reduce the value of R3 with smaller values whilst still achieving the same gain and filter turnover. R3, which would otherwise be quite high in value, could be the subject of stray capacitance. Replacing resistor R3 by the T network of resistors provides the same gain but using smaller values of resistors. The corner frequency will remain the same, but stray capacitance effects can be reduced considerably.

Figure 6C:
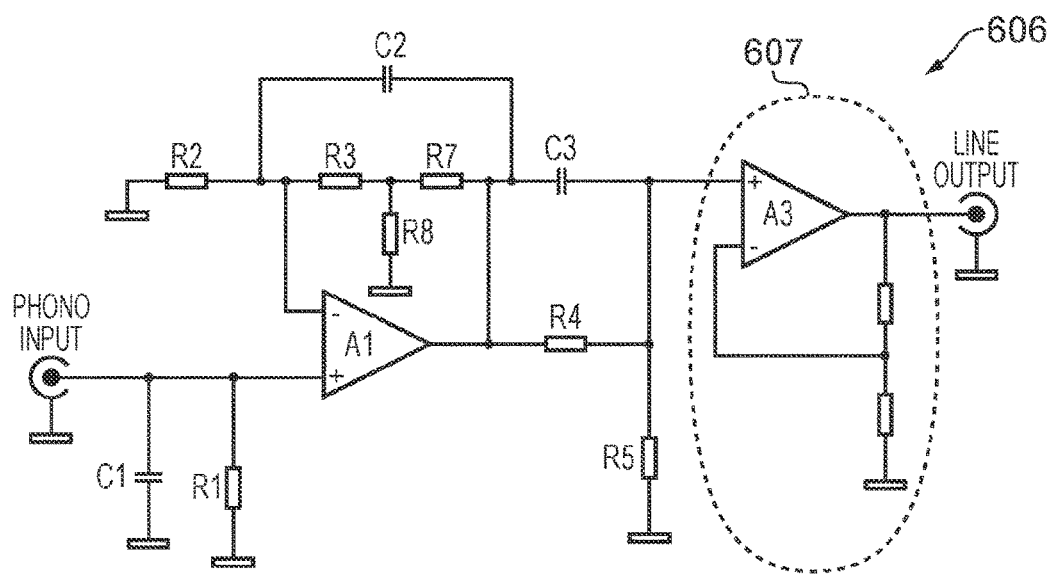

FIG. 6C schematically illustrates a further example of an apparatus 606 according to the present disclosure. The apparatus 606 is similar to the apparatus 604 of FIG. 6B, with the addition of means 607 configured to provide an output buffer, e.g. an output buffer amplifier either having unity gain or some gain, so as not to load the passive filter. The output filter 601 has a 12 dB insertion loss which may be acceptable in terms of output level (output voltage), but if more output is required an output buffer amplifier could be provided. The output buffer amplifier can be configured for the required gain or can include a gain control in the form of a variable resistor.

In the un-buffered apparatus 600 of FIG. 6A, a load impedance of succeeding/connected equipment can load resistor R5. For a range of expected loads R5 can be adjusted such that R5 combined with the load impedance results in a very close approximation of the required filter frequency. The buffered output stage of FIG. 6C avoids this task.

Figure 6D:
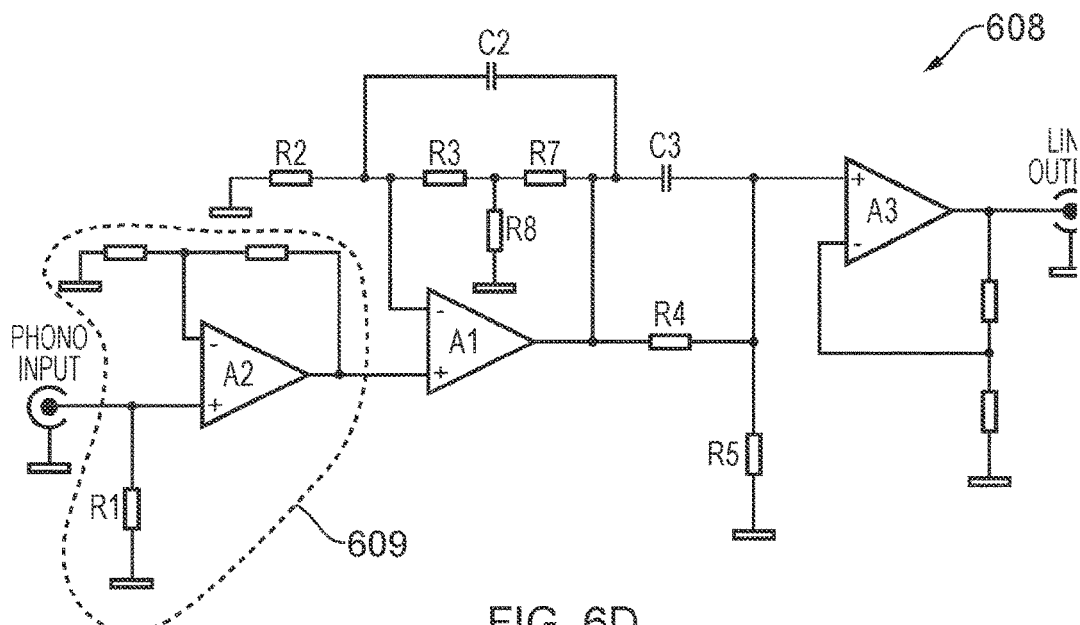

FIG. 6D schematically illustrates a further example of an apparatus 608 according to the present disclosure. The apparatus 608 is similar to the apparatus 606 of FIG. 6C, with the addition of means 609 configured to provide pre-amplification of the audio signal prior to the amplifier A1 applying the frequency response profile Ga(f), e.g. an input pre-preamplifier 609, so as to accommodate for pickup cartridges having a low output, such as moving coil cartridges or similar low output cartridges, where input impedance matters less for low impedance sources.

In the example apparatuses of FIGS. 6A-6D, the apparatuses firstly compensates for a rising response of a pickup cartridge by using the low pass filter 501 turning over at a corner time constant. Rather than choosing an arbitrary turnover point for the low pass filter, 3180 □S is used which coincides with the low frequency time constant of the RIAA response curve. The rate of fall off/cut of the amplifier's gain is −20 dB per decade of frequency, in opposition to the rising output of the cartridge of +20 dB per decade of frequency, resulting in a flat output as far as the cartridge is concerned.

The negative feedback loop around the amplifier may include a current buffer or an amplifier stage in its output contained in the negative feedback loop.

The negative feedback pickup/cartridge equalisation could be adopted in a different way as series negative feedback. It could form part of the feedback loop in a current feedback amplifier, or in the feedback loop of a multiple feedback loop amplifier. It may be included in an AC coupled amplifier or in an instrumentation amplifier. It may be synthesised in a digital signal processor or by computer software.

The above examples have only discussed one channel (mono) but it is appreciated that the examples could be suitably modified for stereo/multichannel use.

The examples show a non-inverting amplifier stage, but in some circumstances it could be used in an inverting amplifier.

In the example apparatuses, record output equalisation is passive after the cartridge equalisation. The apparatuses could be modified such that record output equalisation occurs prior to the cartridge equalisation.

The record output equalisation could be performed in an active stage—built around a device such as an operational amplifier or amplifier built from discrete components (including valves (tubes), bipolar and/or field-effect transistors, and similar devices). It may be synthesised in a digital signal processor or by computer software. It may be achieved in the series feedback of a device such as a bipolar or field-effect transistor, or even a valve (tube), or multiples of these or similar devices. It may be achieved through the use of inductors or simulated inductors.

Whilst the example given above refers to a specific RIAA record frequency response profile and RIAA time constants, it is to be appreciated that record frequency response profiles and time constants, corresponding to other standards may be used having differing responses and/or differing time constant values. For example, alternative time constants could be used for the equalisation of other types of records such as those for NAB (National Association of Broadcasters) NARTB (National Association of Radio and Television Broadcasters), FFRR (Full Frequency Range Recording), or other record label specifications. Additional equalisation networks could be switched or otherwise arranged to provide alternative equalisation functions.

The invention could be modified for use in a virtual ground phono preamplifier for magnetic cartridge. It could be adapted for use with an optical pick-up system. It could be adapted for use with a piezo or capacitor cartridge which through loading may exhibit a similar response to that of a magnetic cartridge.

Although examples of the apparatus have been described above in terms of comprising various components, it should be understood that the components may be embodied as or otherwise controlled by a corresponding processing element or processor of the apparatus. In this regard, each of the components described below may be one of more of any device, means or circuitry embodied in hardware, software or a combination of hardware and software that is configured to perform the corresponding functions of the respective components. For example, the equalisation functionality may be synthesised in a digital signal processor or by computer software.

Figure 7:
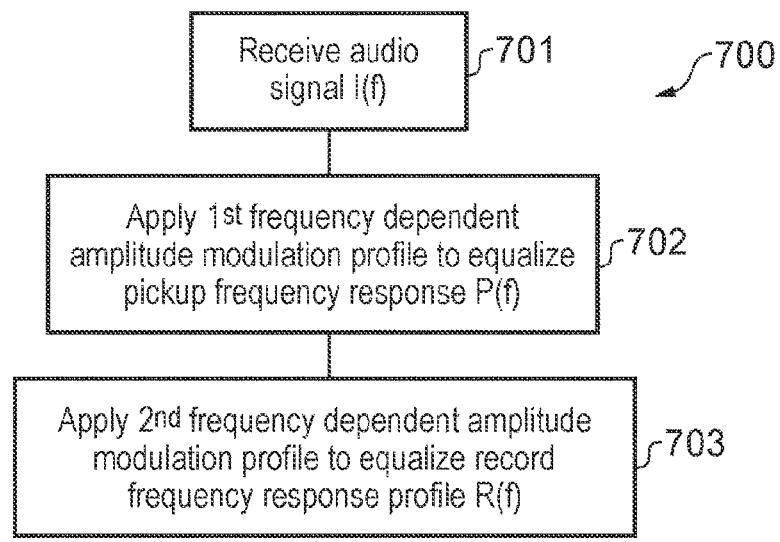
FIG. 7 schematically illustrates an example of a method according to the present disclosure.

FIG. 7 schematically illustrates an example of a method 700 according to the present disclosure. In block 701, an audio signal I(f) is received which is representative of an audio recording mastered at a record frequency response profile R(f), and which is derived from an audio signal pickup device having a pickup frequency response profile P(f). In block 702 a first frequency dependent amplitude equalisation profile is applied to the audio signal. The first frequency dependent amplitude equalisation profile is configured so as to equalise the effect of the pickup frequency response profile in at least a first frequency range F1. Separately from the application of the first frequency dependent amplitude equalisation profile, at least a second frequency dependent amplitude equalisation profile is applied to the audio signal, wherein the at least second frequency dependent amplitude equalisation profile is configured to equalise the effect of the record frequency response profile in at least a second frequency range F3. The second frequency range may be within or partially overlap with the first frequency range.

The flowchart of FIG. 7 represents one possible scenario among others. The order of the blocks shown is not absolutely required, for example, the equalisation of the record frequency response profile R(f) in block 703 could be arranged to occur before the equalization of the pickup frequency response P(f) in block 702.

The first frequency dependent response profile could be further configured such that a frequency dependent amplitude equalisation profile is applied to the audio signal which is configured to equalise both the effect of pickup frequency response profile and the record frequency response profile in a frequency range F2, comprising frequencies less than the first frequency range F1.

Examples of the invention may take the form of a method, an apparatus or a computer program. Accordingly, examples may be implemented in hardware, software or a combination of hardware and software. For example, the equalisation functionality may be synthesised in a digital signal processor or by computer software.

It will be understood that the functionality of each block (of the flowchart method illustrations and apparatus diagrams), and combinations of blocks, could be implemented by computer program instructions of a computer program. These program instructions may be provided to one or more processor(s), processing circuitry or controller(s) such that the instructions which execute on the same create means for causing implementing the functions specified in the block or blocks. The computer program instructions may be executed by the processor(s) to cause a series of operational steps to be performed by the processor(s) to produce a computer implemented process such that the instructions which execute on the processor(s) provide steps for implementing the functions specified in the block or blocks.

Accordingly, the blocks support: combinations of means for performing the specified functions; combinations of steps for performing the specified functions; and computer program instructions/algorithm for performing the specified functions. It will also be understood that each block, and combinations of blocks, can be implemented by special purpose hardware-based systems which perform the specified functions or steps, or combinations of special purpose hardware and computer program instructions.

Figure 8:
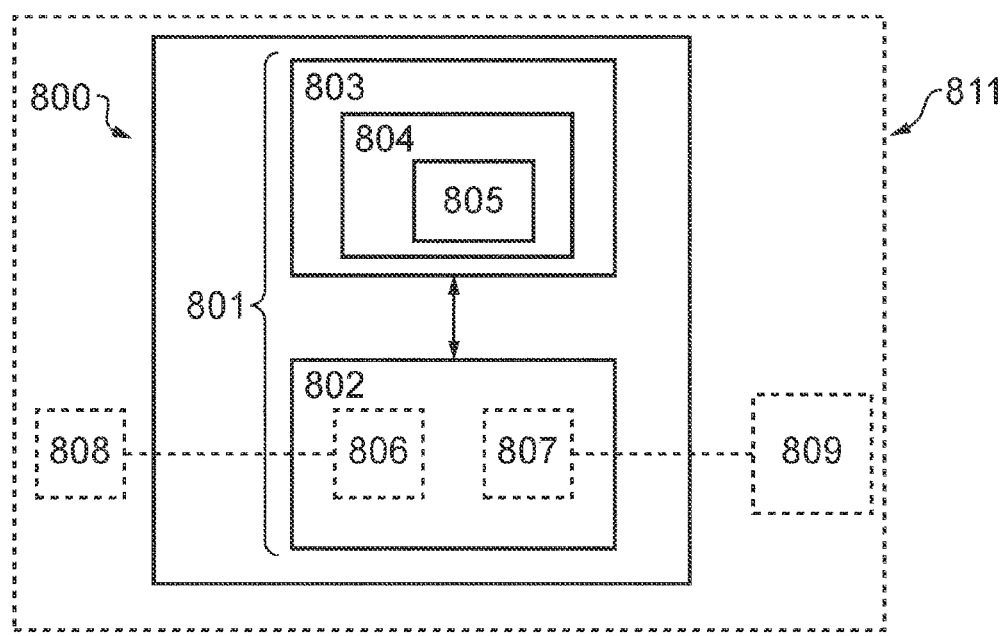
FIG. 8 schematically illustrates a yet further example of an apparatus according to the present disclosure.

FIG. 8 schematically illustrates an example of an apparatus 800 according to certain examples of the implementation of the present disclosure.

The apparatus comprises a controller 801 which can be implemented in hardware alone (e.g. audio signal processing circuitry as in FIGS. 6A-D) or processing circuitry (comprising one or more processors and memory circuitry comprising one or more memory elements), having certain aspects in software including firmware alone or can be a combination of hardware and software (including firmware) using instructions that give rise to the equalisation and amplification functionality, for example, by using executable computer program instructions in a general-purpose or special-purpose processor that may be stored on a computer readable storage medium (disk, memory etc) or carried by a signal carrier to be performed by such a processor.

In the illustrated example of FIG. 8, the apparatus 800 comprises a controller 801 which is provided by at least one processor 802 and at least one memory 803. The memory stores a computer program 804 comprising computer program instructions 805 that control the operation of the apparatus when loaded into the processor 802. The computer program instructions provide the logic and routines that enables the apparatus to perform the functionality and methods described above.

The processor 802 is configured to read from and write to the memory 803. The processor 802 may also comprise an input interface 806 via which an audio signal I(f), data and/or commands are input to the processor 802 and an output interface 807 via which an output audio signal O(f), data and/or commands are output by the processor 802.

The memory 803 stores a computer program 804 comprising computer program instructions 805. The instructions control the operation of the apparatus 800 when loaded into the processor 802. The processor 802 by reading the memory 803 is able to load and execute the computer program 804. The computer program instructions 805 provide the logic and routines that enables the apparatus 800 to perform the functionality and methods described above.

The apparatus may be provided in a module. As used here 'module' refers to a unit or apparatus that excludes certain parts/components that would be added by an end manufacturer or a user.

Figure 9:
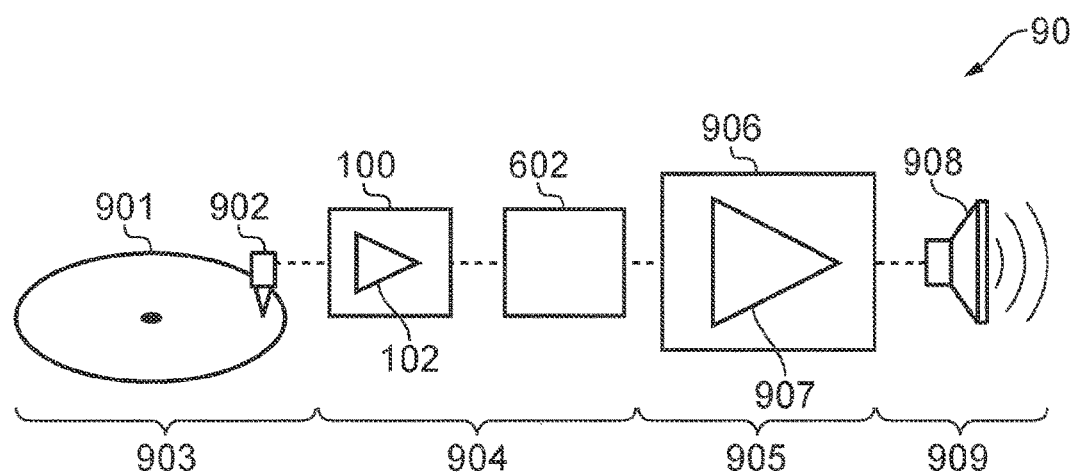
FIG. 9 schematically illustrates an example of a system according to the present invention.

FIG. 9 schematically illustrates an example of a system 900 according to the present invention. The system comprises an analogue sound storage medium, such as a record 901 which is mastered according to a record frequency response profile R(f). Audio signals I(f) representative of the analogue sound are derived from the record via pickup device 902, which has its own pickup frequency response profile P(f), in a pickup stage 903. The audio signals are provided to an apparatus 100, such as in FIG. 1 which equalises the frequency spectrum of the input audio signal I(f) so as to account for the pickup frequency response P(f). After the pickup frequency response equalisation, the output audio signal is further equalised via means 602 so as to account for the record frequency response R(f). These two separate equalisation stages may also include pre-amplification so as to provide a pre-amplification stage 904. Following pre-amplification, a main/primary amplification stage 905 in which an amplifying device 906 comprising an amplifier 907 further amplifies the audio signal. Following the main amplification stage, the signal may be outputted, for example audio output via one or more speakers 908 or headphones in output stage 909. Alternatively, the output audio signal may be digitized for digital output/storage/transmission.

Features described in the preceding description may be used in combinations other than the combinations explicitly described.

Although functions have been described with reference to certain features, those functions may be performable by other features whether described or not.

Although features have been described with reference to certain examples, those features may also be present in other examples whether described or not.

It should be appreciated that modifications to the examples given can be made without departing from the scope of the invention as claimed.

As used in this application, the term 'circuitry' refers to all of the following:

(a) hardware-only circuit implementations (such as implementations in only analogue and/or digital circuitry) and (b) to combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and (c) to circuits, such as a microprocessor(s) or a portion of a microprocessor(s), that require software or firmware for operation, even if the software or firmware is not physically present.

This definition of 'circuitry' applies to all uses of this term in this application, including in any claims. As a further example, as used in this application, the term "circuitry" would also cover an implementation of merely a processor (or multiple processors) or portion of a processor and its (or their) accompanying software and/or firmware.

Examples of the present invention provide both apparatuses (and corresponding methods) consisting of various modules or means that provide the described functionality. The modules or means may be implemented as hardware, or may be implemented as software or firmware to be performed by a computer processor. In particular, in the case of firmware or software, examples of the invention can be provided as a computer program product including a computer readable storage structure embodying computer program instructions (i.e. the software or firmware) thereon for performing by the computer processor.

The term 'comprise' is used in this document with an inclusive not an exclusive meaning. That is any reference to X comprising Y indicates that X may comprise only one X or may comprise more than one X. If it is intended to use 'comprise' with an exclusive meaning then it will be made clear in the context by referring to "comprising only one . . . " or by using "consisting".

In this brief description, reference has been made to various examples. The description of features or functions in relation to an example indicates that those features or functions are present in that example. The use of the term 'example' or 'for example' or 'may' in the text denotes, whether explicitly stated or not, that such features or functions are present in at least the described example, whether described as an example or not, and that they can be, but are not necessarily, present in some of or all other examples. Thus 'example', 'for example' or 'may' refers to a particular instance in a class of examples. A property of the instance can be a property of only that instance or a property of the class or a property of a sub-class of the class that includes some but not all of the instances in the class.

Whilst endeavouring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

I claim:

1. An apparatus for amplifying an audio signal derived from a constant velocity audio signal pickup device, wherein the audio signal is representative of an audio recording mastered to a record frequency response profile, and wherein the pickup device has a pickup frequency response profile having a consistent rise in the pickup frequency response profile of 20 dB per decade of frequency, the apparatus comprising:

a voltage amplifier having a maximum open loop frequency response profile in a first frequency range comprising at least the range 100 Hz-5,000 Hz, wherein the maximum open loop frequency response profile has a constant rate of fall off of 20 dB per decade of frequency over the first frequency range, the amplifier being configured to apply, in at least the first frequency range, a frequency response profile to the audio signal;

wherein the frequency response profile applied to the audio signal is configured such that:

it provides a constant fall off response with increasing frequency of 20 dB per decade of frequency over the first frequency range thereby equalising the pickup frequency response profile over the first frequency range, and a difference between a maximum amount of gain able to be applied by the amplifier and an amount of gain applied to the audio signal by the amplifier is constant throughout the first frequency range; and wherein the amplifier is configured to apply a frequency dependent gain to the audio signal in a second frequency range that is configured to equalise both the effect of the pickup frequency response profile and the record frequency response profile on the audio signal in the second frequency range, wherein the second frequency range comprises frequencies lower than those of the first frequency range.

2. The apparatus of claim 1, wherein the first frequency range further comprises at least one of:

low bass frequencies, high bass frequencies, low treble frequencies, high treble frequencies, low audible frequencies, high audible frequencies, and an audible range.

3. The apparatus of claim 1, wherein the amplifier is configured such its maximum open loop frequency response profile comprises a flat response for the second frequency range up to a first frequency and, following the first frequency, the constant rate of fall off in the response for the first frequency range.

4. The apparatus of claim 3, wherein the first frequency is at least one of:

based on a frequency of an inflection point between two frequency regions of a record frequency response profile having differing responses, wherein the audio signal is representative of an audio recording mastered to the record frequency response profile; and 50 Hz.

5. The apparatus of claim 3, wherein the constant rate of fall off in the response is at least one of:

based on a rise in the frequency response of the pickup frequency response profile; and 20 dB per decade of frequency.

6. The apparatus of claim 1, wherein the apparatus further comprises at least one means configured to apply a frequency dependent amplitude equalisation to the audio signal in at least a third frequency range to equalise the effect of the record frequency response profile on the audio signal in the at least the third frequency range.

7. The apparatus of claim 1, wherein the amplifier is provided with a feedback loop, preferably wherein the feedback loop comprises at least one of:

a negative feedback loop; and a low pass filter.

8. The apparatus of claim 1, wherein the apparatus further comprises at least one of:

means configured to provide peaking and damping for the pickup device;

means configured to prevent load capacitance affecting an output of the amplified audio signal;

means configured to provide an output buffer;

means configured to provide pre-amplification of the audio signal prior to the amplifier applying the frequency response profile.

9. The apparatus of claim 1, wherein the apparatus is configured so as to provide:

pre-amplification of a phono signal;

equalisation of a pickup frequency response profile; and equalisation of a record frequency response profile.

10. A method for amplifying an audio signal derived from a constant velocity audio signal pickup device, wherein the audio signal is representative of an audio recording mastered to a record frequency response profile, and wherein the pickup device has a pickup frequency response profile having a consistent rise in the pickup frequency response profile of 20 dB per decade of frequency, the method comprising:

applying via a voltage amplifier, in at least a first frequency range comprising at least the range 100 Hz -5,000Hz, a frequency response profile to the audio signal;

wherein the voltage amplifier has a maximum open loop frequency response profile in the first frequency range, and wherein the maximum open loop frequency response profile has a constant rate of fall off of 20 dB per decade of frequency over the first frequency range;

wherein the frequency response profile applied to the audio signal is configured such that:

it provides a constant fall off response with increasing frequency of 20 dB per decade of frequency over the first frequency range thereby equalising the pickup frequency response profile over the first frequency range, and a difference between a maximum amount of gain able to be applied and an amount of gain applied to the audio signal is constant throughout the first frequency range; and applying a frequency dependent gain to the audio signal in a second frequency range that is configured to equalise both the effect of the pickup frequency response profile and the record frequency response profile on the audio signal in the second frequency range, wherein the second frequency range comprises frequencies lower than those of the first frequency range.

11. An apparatus comprising means configured to cause the apparatus at least to perform the method as claimed in claim 10.

12. A phono preamplifier comprising the apparatus of claim 1.

13. An amplifier comprising the preamplifier of claim 12.

14. A system comprising:

the apparatus of claim 1 and at least one or more of:

an audio signal pickup device, an amplifier, an output for electrically outputting the amplified audio output, and one or more audio output devices for audibly outputting the amplified audio output.

* * * * *